(12) United States Patent
Kesler

(10) Patent No.: US 7,675,346 B2
(45) Date of Patent: Mar. 9, 2010

(54) SWITCHING CONTROL SYSTEM TO REDUCE COIL OUTPUT VOLTAGE WHEN COMMENCING COIL CHARGING

(75) Inventor: Scott B. Kesler, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 711 days.

(21) Appl. No.: 11/484,502

(22) Filed: Jul. 11, 2006

(65) Prior Publication Data
US 2008/0012041 A1    Jan. 17, 2008

(51) Int. Cl.
*H03K 17/04* (2006.01)
(52) U.S. Cl. .................. 327/376; 327/108; 327/434
(58) Field of Classification Search .......... 327/370, 327/376, 377, 72, 77–81, 427, 434, 170, 327/108–112
See application file for complete search history.

(56) References Cited

U.S. PATENT DOCUMENTS 7,307,462 B2 * 12/2007 Cheng et al. ............... 327/175
7,308,239 B2 * 12/2007 Suwabe .................. 455/194.2
2005/0270807 A1 * 12/2005 Strijker ................... 363/21.01
2007/0120545 A1 * 5/2007 Hata et al. ................ 323/282

\* cited by examiner

*Primary Examiner*—Long Nguyen
*Assistant Examiner*—Sibin Chen
(74) *Attorney, Agent, or Firm*—Jimmy L. Funke

(57) ABSTRACT

A switching control system and method is provided that optimizes switching efficiencies for power switching applications including automotive ignition systems, solenoid drivers, motor drivers and power regulation systems. In an ignition system, a coil current switching magnitude is controlled at the start of ignition coil charging, thereby avoiding an untimely spark event. When the transistor threshold voltage is reached, the collapse rate of the ignition system transistor collector voltage is reduced by reducing the gate charging current. The reduced collector voltage slew rate results in a reduced primary and secondary coil output voltage. After the collector voltage collapses, a continued rapid charge is provided to place the transistor in a hard saturation bias condition. In an aspect, the present invention dynamically determines the threshold voltage of a power transistor. A mirror capacitor substantially matches a transistor gate voltage and a signal is generated when the mirror capacitor voltage proportionally exceeds the transistor gate voltage as a consequence of the transistor reaching a threshold voltage.

7 Claims, 4 Drawing Sheets

SWITCHING CONTROL SYSTEM TO REDUCE COIL OUTPUT VOLTAGE WHEN COMMENCING COIL CHARGING

FIELD OF THE INVENTION

The invention relates generally to a switching control system, and more particularly to dynamically determining a threshold voltage and controlling a voltage collapse rate of a power transistor to reduce load output voltage.

BACKGROUND OF THE INVENTION

Conventional inductive-type automotive ignition systems commonly utilize power semiconductor devices to control the switching of current through ignition coils. Such semiconductor devices are typically controlled so as to switch from an "off" state to a fully saturated "on" state within a short time period, whereby such switching results in the voltage across the ignition coil changing rapidly from substantially zero volts to near battery voltage.

A common type of semiconductor device used in this type of application is an insulated gate bipolar transistor (IGBT). These devices switch large currents while being controlled by the modulation of small voltages on the IGBT's control terminal or gate. Positive voltage applied to the gate in excess of the IGBT's threshold voltage causes the IGBT to begin conducting available current through its collector and emitter terminals. Since the coil load switched by the IGBT is inductive in nature, when the IGBT is initially switched on, the inductance of the coil prevents immediate flow of current into the IGBT. This results in a rapid collapse of the voltage across the collector and emitter terminals of the IGBT. The fast change in IGBT voltage appears across the primary winding of the ignition coil. Since an ignition coil is typically a two winding transformer, the change in primary voltage is multiplied by the turns ratio of the primary and secondary windings of the coil, producing a much higher voltage at the coil's secondary output terminal. If the voltage at the coil secondary output terminal is sufficiently high in magnitude, a spark may result across the gap of a connected spark plug at an unwanted moment. The spark event may occur at a time far in advance of the desired ignition time defined by the internal combustion engine piston position resulting in poor engine performance or significant damage.

A number of systems have been employed to prevent a mistimed spark event, including the use of current blocking diodes in series with the coil's secondary winding, and pulsed or phased turn on techniques that use the coil's natural response to reduce the voltage resulting from the IGBT switching event. These systems either prevent secondary current flow altogether or reduce the secondary voltage response such that a spark does not occur. However, these systems result in either additional system cost associated with the diode or increased IGBT gate voltage control circuitry complexity necessary for implementation of the pulsed turn-on method. Conventional systems increase system costs by a non-negligible amount.

Controlling a change in a coil primary voltage in these systems involves determining the actual bias conditions on the IGBT's collector terminal. Direct observation of this voltage necessarily involves managing voltages on the order of several hundred volts at the collector terminal when the IGBT is switched off at the desired spark generation time. Since most conventional systems employ control circuitry implemented in integrated circuit form, using either standard CMOS or bipolar processes, direct application of these high collector voltages results in damage to the integrated circuitry. Voltage divider components external to the integrated circuitry can reduce the voltages to a manageable level, however, voltage dividing networks add system cost and can interfere with other system performance requirements such as limitations on collector leakage currents. Collector voltage control via capacitive feedback methods provides information relating only to the rate of change of the collector voltage and not to the magnitude of the collector voltage, which reduces their effectiveness. Capacitive voltage sensing methods also add system cost due to the need for high voltage capable capacitors.

SUMMARY OF THE INVENTION

A switching control system and method is provided that optimizes switching efficiencies for power switching applications including automotive ignition systems, solenoid drivers, motor drivers and power regulation systems. The present invention switches various types of power semiconductor devices including a field-effect transistor (FET) and an insulated gate bipolar transistor (IGBT), the IGBT commonly utilized to control the switching of current in ignition coils.

Threshold voltages of coil current switching transistors vary, and the present invention removes error in switching control by dynamically determining the threshold voltage of a power transistor. Implementation of circuitry is thus feasible to minimize dwell timing errors and current conduction overlap in these systems. In an example application, namely an automotive ignition system, the present invention additionally reduces the switching magnitude of coil current at the start of ignition coil charging thereby avoiding an untimely spark event. The collapse of the ignition system IGBT collector voltage is controlled. The reduced collector voltage slew rate results in a reduced secondary coil winding output voltage. The collector slew rate is controlled without requiring voltage divider components or collector voltage feedback systems, thus further reducing costs. Complexity of control circuitry is minimally increased and the present invention provides a substantially lower cost design as compared to conventional switching control systems. As an example, coil assembly costs are reduced in part by using a novel system rather than an expensive coil secondary series diode or a pulsed or phased turn on technique.

Features of the invention are achieved in part by charging a power transistor utilizing timed switching of fast and slow gate charging. Rapid gate charging is provided up to the transistor threshold voltage. When the transistor threshold voltage is reached and the load is inductive in nature, the collector voltage rapidly decreases. The present invention significantly slows the collector voltage decrease. A slow transition is employed through the transistor threshold voltage region. After the collector voltage has collapsed, a continued rapid charge is provided to place the transistor in a hard saturation bias condition. The charging currents are selected such that system delay is minimized.

A first circuit charges a transistor gate at a first current level during a turn-on phase of the transistor. In an embodiment, the turn-on phase of the transistor commences when the gate of the transistor is discharged, the threshold voltage of the transistor is undetected, and the coil current is less than a predetermined coil current level. The first circuit then charges the transistor gate at a reduced second current level when a threshold voltage of the transistor is detected. The first circuit then resumes charging the transistor gate at the greater first current level when a coil current reaches the predetermined current level. In an embodiment the predetermined current level is in the range of 1 ampere to 2 amperes, and is set at a level to drive the transistor into saturation in a minimized time. In an embodiment the resumed charging of the transistor gate at the first current level is continued through a coil charging period and an engine timing dwell event.

A second circuit dynamically determines the threshold voltage of the transistor. In an embodiment the second circuit determines the threshold voltage of the transistor by dynamically detecting a reduction of a charging rate of the transistor gate. The second circuit charges a mirror capacitor at a rate substantially matching a charging rate of the transistor gate, during the turn-on phase of the transistor, and generates a signal when either the mirror capacitor charging rate exceeds the transistor gate charging rate by a predetermined rate or a sample voltage of the mirror capacitor proportionally exceeds a sample voltage of the transistor gate by a predetermined magnitude, as a consequence of the change in apparent charging rate of the transistor gate due to Miller effect multiplication of the gate capacitance.

In an embodiment, the first circuit includes a comparator and a logic gate. The comparator detects the predetermined coil current through the transistor via an offset voltage to an input of the comparator. The offset voltage is employed to set the predetermined coil current level. The comparator outputs either a detected predetermined coil current signal or an undetected predetermined coil current signal. The logic gate receives the comparator output and also an output signal from the second circuit. The second circuit output signal is either a detected threshold voltage signal or an undetected threshold voltage signal. The logic gate instructs charging the transistor at the first current level when the logic gate receives the undetected predetermined coil current signal and the undetected threshold voltage signal. The logic gate instructs charging the transistor at the second current level when the logic gate receives the undetected predetermined coil current signal and the detected threshold voltage signal. Further, the logic gate instructs charging the transistor at the first current level when the logic gate receives the detected predetermined coil current signal.

Other features and advantages of this invention will be apparent to a person of skill in the art who studies the invention disclosure. Therefore, the scope of the invention will be better understood by reference to an example of an embodiment, given with respect to the following figures.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE INVENTION

Exemplary embodiments are described with reference to specific configurations. Those of ordinary skill in the art will appreciate that various changes and modifications can be made while remaining within the scope of the appended claims. Additionally, well-known elements, devices, components, methods, process steps and the like may not be set forth in detail in order to avoid obscuring the invention. Further, unless indicated to the contrary, the numerical values set forth in the following specification, figures and claims are approximations that may vary depending upon the desired characteristics sought to be obtained.

Power semiconductor devices are commonly used to control the switching of current through systems including automotive ignition systems, solenoid drivers, motor drivers and power regulation systems. Switching control systems are employed to reduce coil output voltage. That is, a rapid voltage collapse rate across terminals of a semiconductor device appears across primary windings of an ignition coil. The change in primary voltage further produces a significantly higher voltage at a coil's secondary output terminal due to the turns ratio of the primary and secondary coil windings. The secondary voltage can produce an untimely spark. As discussed supra, conventional systems add circuit complexity, increase system costs by a non-negligible amount and can add switching control timing error.

Figure 1:
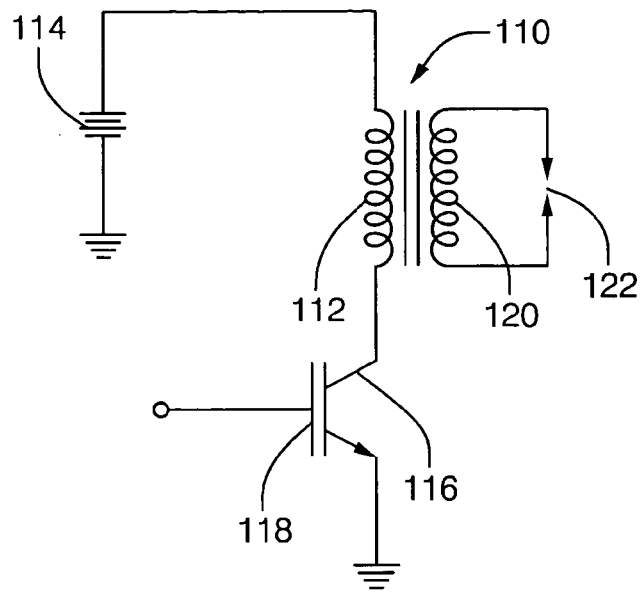
FIG. 1 is a schematic diagram of a conventional inductive ignition circuit.

Referring to FIG. 1, an inductive ignition circuit is illustrated including an ignition coil 110 having a primary winding 112 serially coupled to an automotive battery 114 and a transistor switch 116 shown as an IGBT. Other switches may be used, although it is important that the switch be lossy, that is, energy is absorbed in the switch as it is being turned off. The gate 118 of the transistor receives the spark command pulse to turn the switch 116 on or off. The ignition coil also has a secondary winding 120 connected across a spark plug gap 122. Upon initial closing of the transistor switch 116 a high voltage, in the opposite sense, is developed in the secondary winding 120 and typically is accompanied by oscillations or ringing of such magnitude that premature firing of the spark plug can occur, sometimes causing combustion in a corresponding cylinder.

Figure 2:
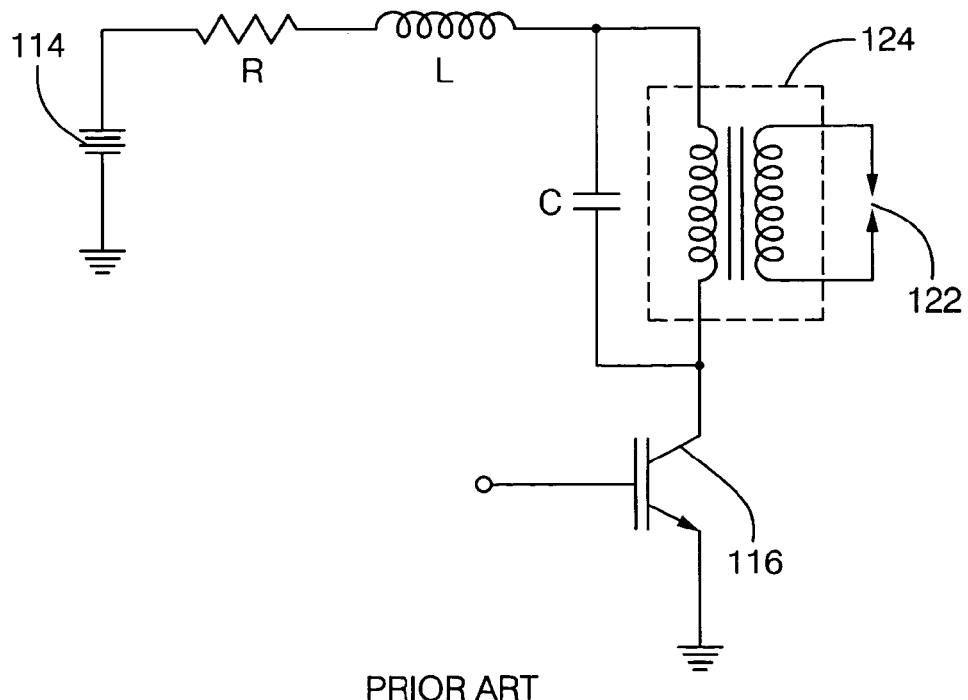
FIG. 2 is a schematic diagram of an equivalent circuit of the conventional circuit of FIG. 1.

An equivalent circuit for the coil turn-on condition is shown in FIG. 2 wherein the ignition coil 110 is replaced by an ideal transformer 124, and secondary impedances are reflected to the primary side and combined with primary impedances to result in resistance R and leakage inductance L in series with the battery and the transformer primary, and a capacitance C across the primary. The application of an ordinary dwell command to the gate 118 of the transistor 116 would initiate a primary current causing an energy buildup in the leakage inductance L which would oscillate with the capacitance C, causing the undesired oscillations or ringing. One approach to ringing, illustrated in U.S. Pat. No. 5,392,754, entitled "Method of Suppressing Ringing in an Ignition Circuit" assigned to Delco Electronics Corp, describes suppressing ringing by a short switch turn-on pulse to a transistor gate followed by a short delay prior to the main dwell period, causing a beginning build up of primary current and circuit energy followed by absorption of energy in the switch during switching to dissipate circuit energy needed for oscillation.

Controlling an IGBT collector voltage response by controlling the gate voltage is limited by the variation in actual IGBT threshold voltage. Slow charging of the IGBT gate voltage is effective in reducing the rate of change of the collector voltage, but slow charging from a fully discharged state introduces significant error in the coil turn-on timing. Further, slow charging of the IGBT gate does not give an indication of when the IGBT is fully turned on. Without such information, slow charging of the IGBT gate can result in limitation of the coil current charging rate due to the resulting linear control of the IGBT's collector current. Such limitation disrupts the overall ignition system timing, potentially reducing the energy available in the coil at the time a spark event is desired.

Rapid charging of the IGBT gate voltage to a predetermined sub-threshold voltage reduces the error in the coil turn-on timing, but due to the normal variation in IGBT gate threshold voltages the timing error is non-negligible. The threshold voltage region for an IGBT varies with factors including semiconductor manufacturing process variations and current environmental conditions. The gate voltage threshold levels depend on the operating temperature of the specific semiconductor device. For systems that experience a wide range of operating temperatures, the threshold voltage region can vary. Even if devices are sorted for specific threshold voltage ranges, system temperature variations will introduce error in finely tuned control circuitry. Temperature compensation circuitry can be added but again system costs are increased. The present invention addresses these issues and more.

A system and method are described herein for controlling a voltage collapse rate of a power transistor, thereby reducing a coil output voltage. The present invention slowly charges the IGBT gate during the time that the gate voltage passes through the threshold voltage region. After passing through the threshold voltage region, where the collector voltage would otherwise be changing rapidly, the invention resumes a fast charge of the gate, bringing the IGBT into full saturation, thereby enabling coil charging at the desired rate. Additionally, the present invention dynamically determines the threshold voltage of a semiconductor switching device during every switching event, providing immediate feedback and compensation for changes in threshold voltage. The threshold voltage can also be stored for future reference.

While the present invention is described with reference to an insulated gate bipolar transistor (IGBT), it is to be appreciated that other transistors can similarly be utilized with the present invention including, field-effect transistor (FET), metal-oxide semiconductor FET (MOSFET), and junction field-effect transistor (JFET). Further, while a switching control system to reduce coil output voltage is described herein, it is to be appreciated that the present invention may additionally be utilized to reduce other load output voltages besides a coil, inductive or otherwise.

Figure 3:
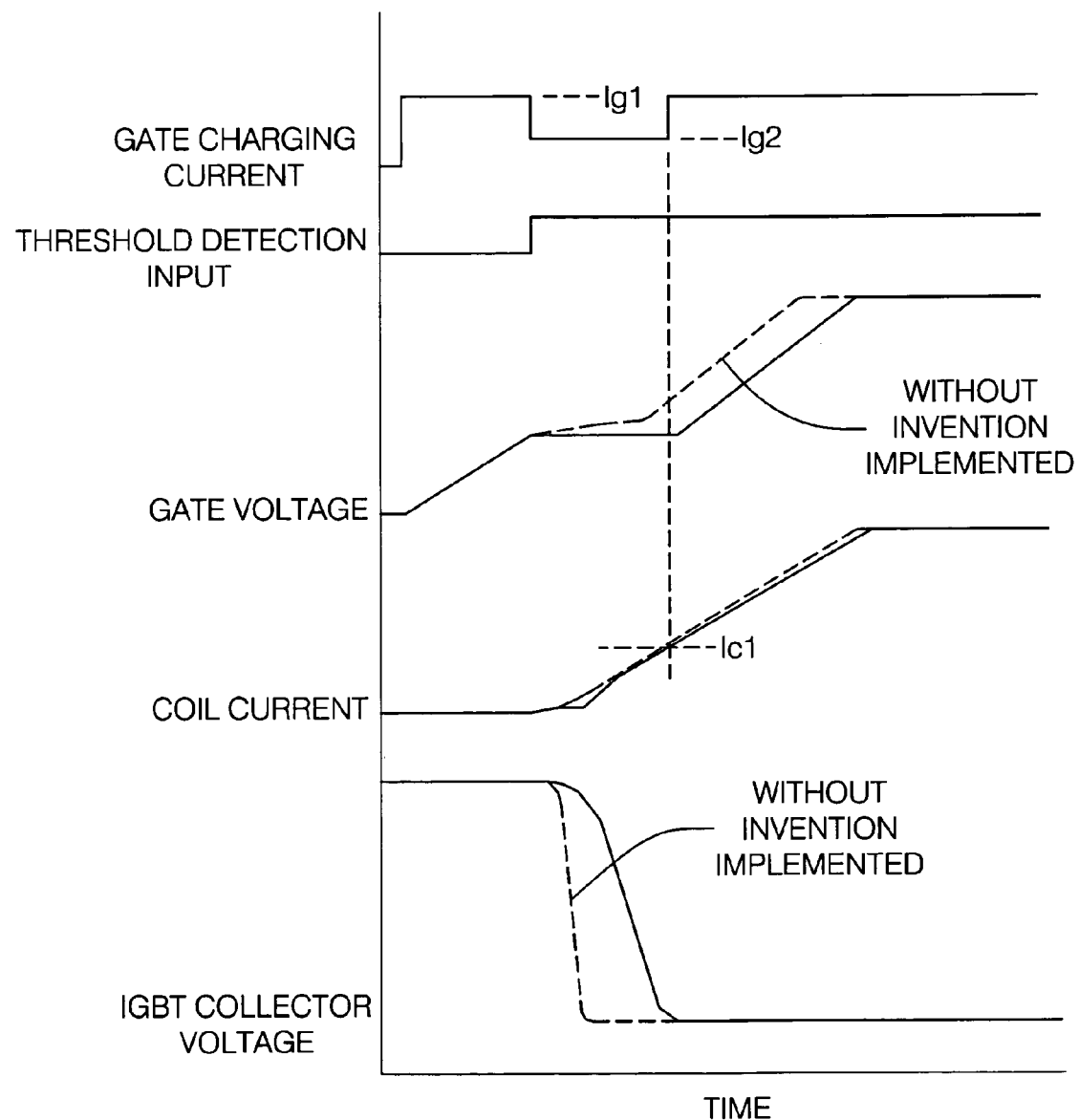
FIG. 3 is a timing diagram example that illustrates a comparison of a gate voltage, a coil current and a collector voltage as a gate charging current is adjusted with a threshold detection input, in accordance with an embodiment of the present invention.

Referring to the drawings wherein identical reference numerals denote the same elements throughout the various views, FIG. 3 is a timing diagram that illustrates a comparison of a gate voltage, a coil current and a collector voltage as a gate charging current is adjusted with a threshold detection input. Terminal voltages of an IGBT are shown passing through a sub-threshold, threshold, and above-threshold region of the IGBT operation. The gate voltage and collector voltage are shown with (solid line) and without (dotted line) the invention implemented.

The present invention controls the IGBT collector voltage collapse rate by controlling the gate voltage slew rate. The gate is slowly charged during the time that the gate passes through the threshold voltage region. The gate charging current source is switched to different levels to substantially reduce the rate of IGBT collector voltage collapse, without significantly affecting the overall system timing. The IGBT gate is initially charged at a rate defined by current level Ig1. The magnitude of the gate charging current Ig1 establishes the time required to charge the gate from a discharged state to the IGBT gate threshold voltage, and then later the time to complete the charge from slightly above the threshold voltage to the fully charged voltage.

When the threshold of the IGBT is detected (as discussed infra), the charging current is reduced to a substantially lower level Ig2. This reduced charging current Ig2 causes the IGBT to transition from the off state to a conducting state at a much slower rate than if the gate had been continuously charged by current Ig1. The consequence of this slow turn-on event is a reduction in the slew rate of the IGBT collector voltage. This reduced slew rate is desirable since it results in less voltage developed at the ignition coil primary and secondary winding terminals. While the current level Ig2 must be chosen to minimize collector voltage slew rate it must not add significant delay to the total charging cycle. The calculations to establish this gate charging current can be performed by one skilled in the art.

The gate charging current is subsequently returned to the current level Ig1 when the coil current has reached a predetermined level Ic1. Returning to the higher level charging current, after transition through the threshold region has occurred, ensures that the IGBT will be driven into saturation in the shortest possible time. The coil current at which the initial charging rate is restored may be detected by any of a number of means including direct sensing of the current via a low value resistor in series with the IGBT emitter, or by examination of the current flowing at a "sense emitter" terminal of the IGBT where a fraction of the total collector current is directed to current measuring circuitry. Other coil current detection methods may be utilized, as long as the detected current level is accurate. In setting a predetermined Ic1 current level, the Ic1 current level should be a level high enough to ensure that the collector voltage has completely transitioned to its low level, and yet not a high level as to excessively extend the low gate current charging period. In an embodiment, the desired current level is in the range of 1 to 2 amperes.

In another embodiment, the coil current is determined to have reached Ic1 by means of a timing function. The timing function includes a predetermined time period that it takes a particular IGBT to transition through a threshold region. When the threshold of the IGBT is detected the timing function starts, and when the predetermined time period expires then the gate charging current is returned to the current level Ig1.

Figure 4:
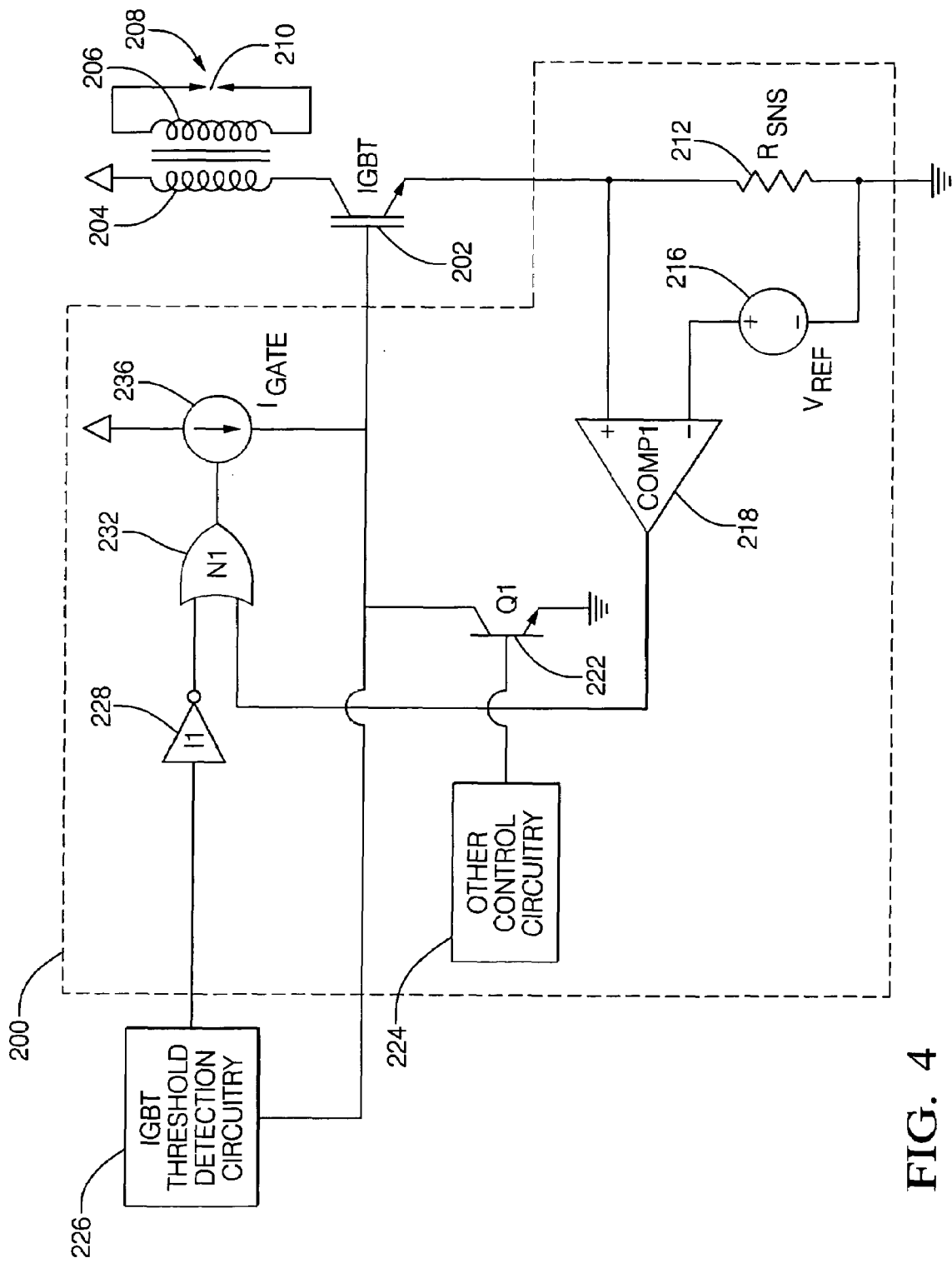
FIG. 4 is a high level schematic of a circuit for controlling a voltage collapse rate of a power transistor, in accordance with an embodiment of the present invention.

FIG. 4 shows a high level schematic of a circuit for controlling a voltage collapse rate of a power transistor in accordance with an embodiment of the present invention. It is to be appreciated that circuitry other than the circuitry shown in FIG. 4 can be used to control a power transistor voltage collapse rate. For example, the comparator and/or logic gate shown in FIG. 4 may be substituted for varied circuitry designs that still control the voltage collapse rate of a power transistor and are thus to be considered within the spirit and scope of the present invention. Now, turning to FIG. 4, at the start of the IGBT 202 turn-on cycle, the primary coil current 204 and secondary coil current 206 are zero due to the IGBT 202 gate having been discharged by transistor 222 (Q1). Since there is no coil current flowing through the IGBT 202 or current sense resistor 212 (Rsns), comparator COMP1 218 outputs a low level. The output from COMP1 218 is connected to one input of NOR gate 232 (N1). At the start of an IGBT turn-on cycle, the IGBT 202 threshold detection circuit 226 provides a low-level logic output to circuit 200. This low level signal is inverted by inverter 228 (I1) and applied to a second input of NOR gate 232. In this condition NOR gate 232 output is low, causing current source Igate 236 to source a current of magnitude Ig1.

The gate of the IGBT 202 is charged at Ig1 until the IGBT 202 threshold detection circuit 226 determines the IGBT 202 is beginning to conduct current (discussed infra). At this time, the threshold detection circuit 226 output switches to a high level. The output from COMP1 218 is still at a low level. This combination of inputs to NOR gate 232 (0,0) result in NOR gate 232 output switching to a high level, causing current source Igate 236 to switch to a second current output level Ig2. Current source Igate 236 continues to source current at the Ig2 level until the output from COMP1 218 changes to a high level due to the coil current having ramped up to a level (Ic1) that causes the voltage across resistor 212 to exceed reference voltage 216 (Vref). The change in the output from COMP 218 causes current source Igate 236 to revert back to the previous current level Ig1. The charging current remains constant through out the remainder of the coil charging period and engine timing dwell event. At the end of the dwell event, a spark is generated in the spark gap 208 defined by ignition plug 210 by rapidly turning off the IGBT 202 via transistor 222 (Q1), which is controlled by control circuitry 224. Subsequent to the spark event, the system is in the desired state for the start of the next IGBT turn-on charging cycle.

Figure 5:
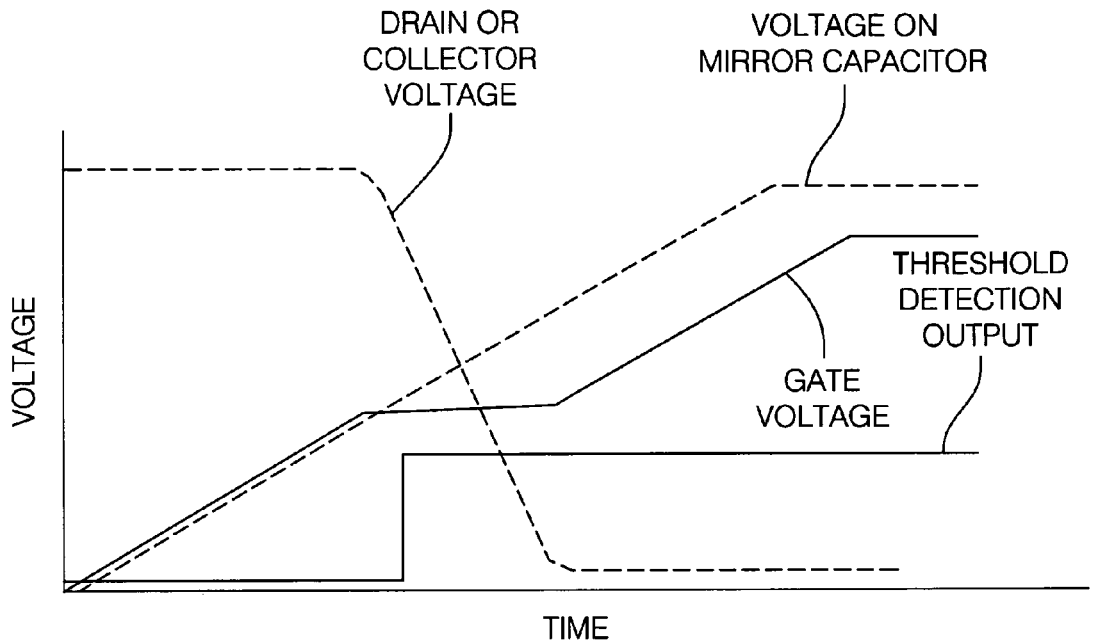
FIG. 5 is a timing diagram example illustrating a comparison of a gate voltage, mirror capacitor voltage, drain or collector voltage, and a threshold detection output when a transistor threshold detection circuit is utilized, in accordance with an embodiment of the present invention.

Referring to FIG. 5, a timing diagram illustrates a comparison of a gate voltage, mirror capacitor voltage, drain or collector voltage, and a threshold detection output when a transistor threshold detection circuit is utilized, in an embodiment of the present invention. The present invention determines the specific gate voltage at which a switching device begins to conduct current. The detection of this threshold voltage level is then utilized to adjust the gate charging current as discussed supra. A mirror capacitor is employed to mimic the behavior of the natural gate to emitter or gate to source capacitance of a switching device. The mirror capacitance is charged via a scaled constant current source during the switching device turn-on time, such that the voltage on the mirror capacitor tracks the voltage appearing on the switching device gate. Since the gate is also charged with a constant current source, the voltages on the two capacitances remain proportionally or nearly equal until the switching device threshold voltage is reached. When the threshold voltage is reached, the switching device collector voltage begins to collapse. The collapsing collector voltage changes the rate that the gate voltage charges, due to the Miller effect multiplication of the apparent gate capacitance. The increase in apparent capacitance results in a reduction of the gate voltage rate of change. At the same time, the mirror capacitance continues to charge linearly, undisturbed by the collapsing collector voltage of the switching device. The change in the relative charging rates between the two capacitances causes the mirror capacitor voltage to eventually exceed the switching device gate voltage by a measurable amount. The difference in voltage between the mirror capacitor voltage and the gate voltage provides a signal and feedback that the switching device gate voltage has reached a threshold voltage. The threshold detection output signal results when the voltage on the mirror capacitor exceeds the gate voltage by a predetermined magnitude. It is to be appreciated that the charging rate of a transistor gate can be detected either by determining that a sample voltage of the mirror capacitor proportionally exceeds a sample voltage of the transistor gate by a predetermined magnitude or by determining that the mirror capacitor charging rate exceeds the transistor gate charging rate by a predetermined rate. By detecting the actual threshold voltage of a switching device in a dynamic manner, a variety of switching circuits (besides the circuit shown in FIG. 4) can be finely tuned thereby increasing switching efficiency, output slew rate control. etc.

In another embodiment, the present invention dynamically determines the threshold voltage level of the transistor and subsequently stores the threshold voltage level in memory for later access rather than repeating the dynamic determining of the transistor threshold voltage level during a subsequent transistor turn-on phase.

Figure 6:
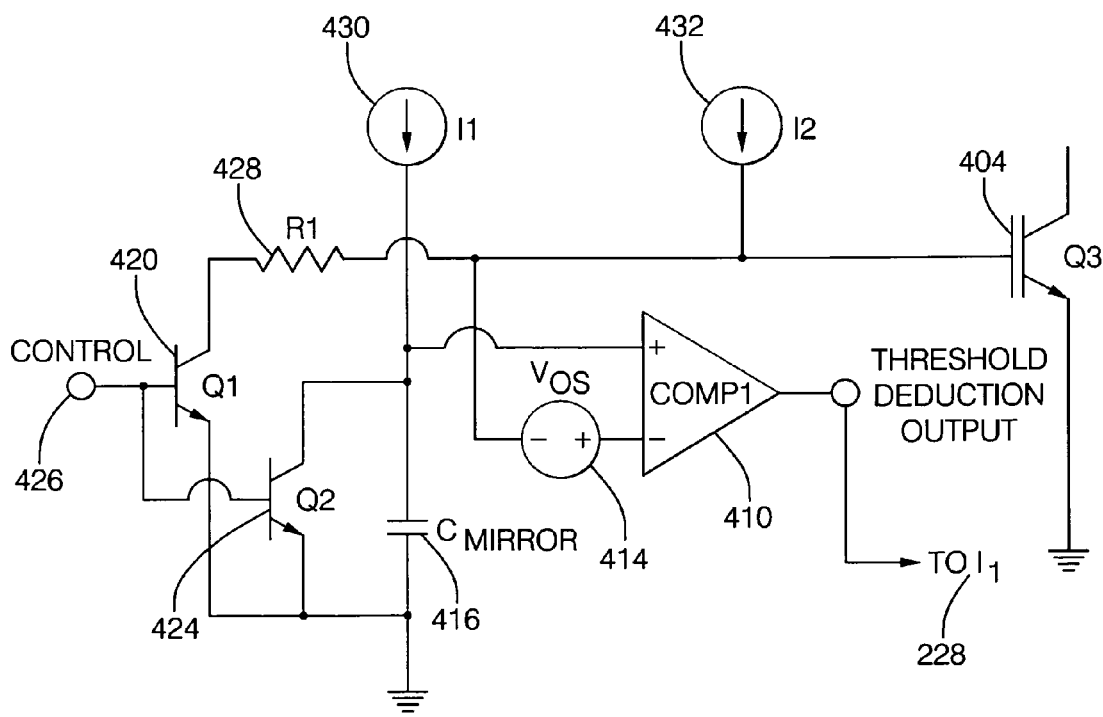
FIG. 6 is a high level schematic of a circuit for dynamically determining a threshold voltage of a semiconductor device, in accordance with an embodiment of the present invention.

FIG. 6 shows a high level schematic of a circuit for dynamically determining a threshold voltage of a semiconductor device in accordance with an embodiment of the present invention. The circuit shown can be utilized for the threshold detection circuit 226 as shown in FIG. 4. It is to be appreciated that threshold detection circuit 226 can utilize other means of determining a threshold voltage as well and is not limited to the circuit or method illustrated in FIG. 6.

IGBT 404 (Q3) is the device for which the threshold voltage is determined. The voltage on the mirror capacitor 416 (CMirror) is compared to the voltage on the gate of the IGBT 404 by comparator 410 (Comp1). The gate capacitance of IGBT 404 and the mirror capacitor 416 are initialized at near zero volts. The capacitors are charged with currents that are proportional to the relative capacitances, causing the voltages on each to increase at the same rate. The threshold is detected at the point that the voltage on the mirror capacitor 416 exceeds the gate voltage by a predetermined voltage magnitude Vos 414. Vos 414 may be set at a small voltage for example 100 millivolts, which allows the IGBT 404 to pass into the threshold region by some minor amount before asserting that the threshold region is reached, thus minimizing any capacitance variability in the IGBT 404 and mirror capacitor 416.

Current source 430 (I1) and mirror capacitor 416 are scaled proportionally to current source 432 (I2) and the gate capacitance of IGBT 404 in order to match the charging rates of the two capacitances. This proportionality can be set up by one skilled in the art. Transistor 420 (Q1) and transistor 424 (Q2) provide discharge paths for the gate of IGBT 404 and mirror capacitor 416, respectively. When the control signal 426 that is connected to the control terminals (bases) of transistor 420 and transistor 424 is at an operationally high level, transistor 420 and transistor 424 are switched into their conducting states, forcing IGBT 404 into its non-conducting state and discharging mirror capacitor 416. The voltage developed across resistor 438 (R1), defined by R1×I2, sets up an initial condition ensuring that the gate voltage of IGBT 404 is greater than the voltage on mirror capacitor 416, thereby establishing a low level output from comparator 410.

When the control signal connected to the control inputs (bases) of transistor 420 and transistor 424 switch low, the charging of mirror capacitor 416 and the gate of IGBT 404 commences. When the voltage across mirror capacitor 416 reaches the sum of the gate voltage of IGBT 404 and Vos 414 (at the threshold voltage level of the IGBT 404), then the threshold detector output switches to a high state. The high output state (threshold detected signal) is then inputted to inverter 228 (I1) and applied to a second input of NOR gate 232 (as described in FIG. 4).

Other features and advantages of this invention will be apparent to a person of skill in the art who studies this disclosure. Thus, exemplary embodiments, modifications and variations may be made to the disclosed embodiments while remaining within the spirit and scope of the invention as defined by the appended claims.

The invention claimed is:

1. A method of dynamically detecting a threshold voltage, comprising:

charging a mirror capacitor at a rate substantially matching a charging rate of a switching device, during a turn-on phase of the switching device;

generating a signal when one of the mirror capacitor charging rate exceeds the switching device charging rate by a predetermined rate, and a sample voltage of the mirror capacitor proportionally exceeds a sample voltage of the switching device by a predetermined magnitude; and comparing an electrical parameter of the mirror capacitor against a corresponding electrical parameter of the switching device, wherein the electrical parameters are one of the mirror capacitor charging rate and the switching device charging rate and the mirror capacitor sample voltage and the switching device sample voltage.

2. The method as in claim 1, wherein the charging rate of the switching device is one of a gate to source charging rate and a gate to emitter charging rate.

3. The method of claim 1, wherein the step of comparing the electrical parameter of the mirror capacitor against the corresponding electrical parameter of the switching device and the step of generating a signal comprises utilization of a comparator electrical device.

4. The method as in claim 3, further comprising generating an offset voltage to an input of the comparator to set one of the predetermined rate and the predetermined magnitude.

5. The method as in claim 3, further comprising setting up an initial condition on the comparator to indicate that the switching device sample voltage is greater than the mirror capacitor sample voltage, prior to charging the mirror capacitor, to establish a desired output level from the comparator.

6. The method as in claim 1, wherein the switching device is one of a field-effect transistor (FET) and an insulated gate bipolar transistor (IGBT).

7. The method as in claim 1, wherein the switching device is connected to and affects one of an automotive ignition coil, a solenoid driver, a motor driver, and a power regulation system.

* * * * *